US012564112B2

(12) United States Patent
Kitajima

(10) Patent No.: US 12,564,112 B2
(45) Date of Patent: Feb. 24, 2026

(54) SEMICONDUCTOR DEVICE AND METHOD FOR DIAGNOSING DETERIORATION OF SEMICONDUCTOR DEVICE

(71) Applicant: Mitsubishi Electric Corporation, Tokyo (JP)

(72) Inventor: Yumie Kitajima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 802 days.

(21) Appl. No.: 17/295,632

(22) PCT Filed: Mar. 1, 2019

(86) PCT No.: PCT/JP2019/008025
§ 371 (c)(1),
(2) Date: May 20, 2021

(87) PCT Pub. No.: WO2020/178882
PCT Pub. Date: Sep. 10, 2020

(65) Prior Publication Data
US 2022/0003808 A1 Jan. 6, 2022

(51) Int. Cl.
*H01L 23/498* (2006.01)
*G01R 31/26* (2020.01)
(Continued)

(52) U.S. Cl.
CPC .... *H01L 23/49811* (2013.01); *G01R 31/2642* (2013.01); *H01L 25/18* (2013.01);
(Continued)

(58) Field of Classification Search
CPC ............ G01R 31/2642; G01R 31/2644; G01R 31/2884; H01L 22/14; H01L 22/24;
(Continued)

(56) References Cited

U.S. PATENT DOCUMENTS 7,271,608 B1 * 9/2007 Vermeire ........... G01R 31/2879
340/653
7,665,049 B2 * 2/2010 Muranaka ............ G05B 19/128
700/121
(Continued)

FOREIGN PATENT DOCUMENTS

JP 09-297116 A 11/1997
JP 2000-214205 A 8/2000
(Continued)

OTHER PUBLICATIONS

International Search Report issued in PCT/JP2019/008025; mailed Mar. 26, 2019.
(Continued)

*Primary Examiner* — Vinh P Nguyen
(74) *Attorney, Agent, or Firm* — Studebaker Brackett PLLC

(57) ABSTRACT
Provided is a technique for enhancing the accuracy of deterioration diagnosis in a semiconductor device. The semiconductor device relating to the technique disclosed in the present specification is provided with a case, a semiconductor chip inside the case, a metal wire bonded to an upper surface of the semiconductor chip, at least one test piece inside the case, and a pair of terminals provided outside the case and connected to the test piece. The test piece is separated from the metal wire inside the case.

18 Claims, 18 Drawing Sheets

(51) Int. Cl.

| | |
|---|---|
| *H01L 23/00* | (2006.01) |
| *H01L 23/538* | (2006.01) |
| *H01L 25/18* | (2023.01) |
| *H02M 7/537* | (2006.01) |

(52) U.S. Cl.
CPC ............ *H01L 23/538* (2013.01); *H01L 24/45* (2013.01); *H01L 24/48* (2013.01); *H01L 2224/45124* (2013.01); *H01L 2224/45147* (2013.01); *H01L 2224/4801* (2013.01); *H01L 2224/48137* (2013.01); *H01L 2924/10253* (2013.01); *H01L 2924/10272* (2013.01); *H01L 2924/1033* (2013.01); *H01L 2924/12032* (2013.01); *H01L 2924/13055* (2013.01); *H01L 2924/13091* (2013.01); *H01L 2924/2076* (2013.01); *H02M 7/537* (2013.01)

(58) Field of Classification Search
CPC . H01L 2224/29339; H01L 2224/32225; H01L 2224/45124; H01L 2224/45147; H01L 2224/45624; H01L 2224/4801; H01L 2224/48137; H01L 2224/83424; H01L 2224/83455; H01L 23/053; H01L 23/24; H01L 23/49811; H01L 23/538; H01L 24/29; H01L 24/32; H01L 24/45; H01L 24/48; H01L 24/83; H01L 25/072; H01L 25/18; H01L 2924/00014; H01L 2924/10253; H01L 2924/10271; H01L 2924/10272; H01L 2924/1033; H01L 2924/12032; H01L 2924/13055; H01L 2924/13091; H01L 2924/2076; H01L 2924/3512; H02M 7/537

USPC ................................................... 324/762.01
See application file for complete search history.

(56) References Cited

U.S. PATENT DOCUMENTS

| | | | | |
|---|---|---|---|---|
| 8,004,304 | B2 * | 8/2011 | Tametani | ................ H01L 24/49 |
| | | | | 324/762.02 |
| 10,978,364 | B2 * | 4/2021 | Fukumoto | ............. H01L 25/072 |
| 11,538,745 | B2 * | 12/2022 | Takakura | ................ H01L 23/34 |
| 2017/0082679 | A1 * | 3/2017 | Sato | ...................... H01L 25/072 |
| 2017/0207179 | A1 | 7/2017 | Kitajima et al. | |
| 2023/0369142 | A1 * | 11/2023 | Hori | ........................ H01L 24/48 |

FOREIGN PATENT DOCUMENTS

| | | |
|---|---|---|
| JP | 2009-022084 A | 1/2009 |
| WO | 2016/031020 A1 | 3/2016 |

OTHER PUBLICATIONS

An Office Action; "Notice of Reasons for Refusal," mailed by the Japanese Patent Office on Oct. 12, 2021, which corresponds to Japanese Patent Application No. 2021-503239 and is related to U.S. Appl. No. 17/295,632 with English translation.

An Office Action mailed by the Chinese Patent Office on Dec. 14, 2023, which corresponds to Chinese Patent Application No. 201980093224.2 and is related to U.S. Appl. No. 17/295,632.

* cited by examiner

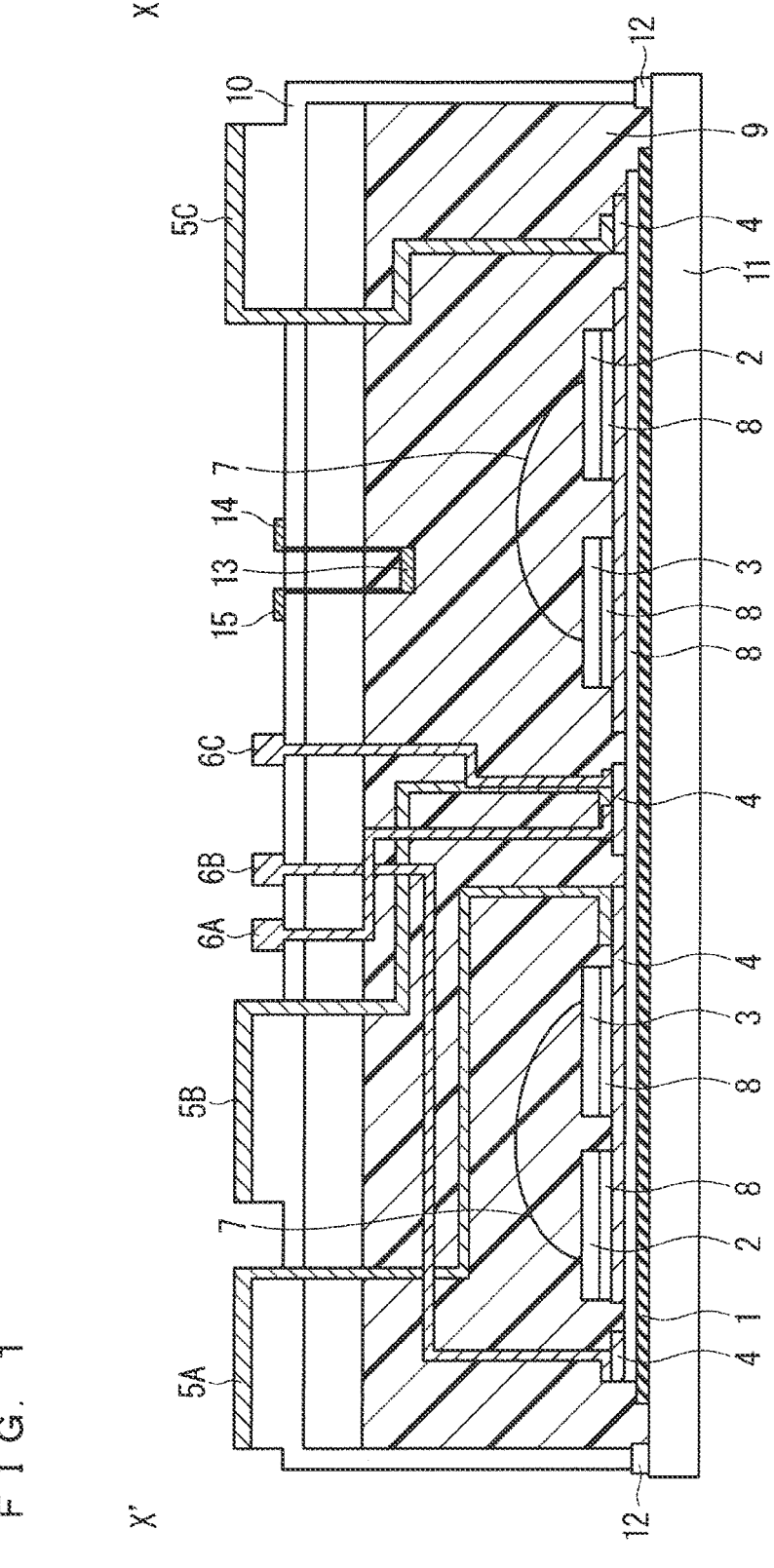
F I G .  1

F I G. 2
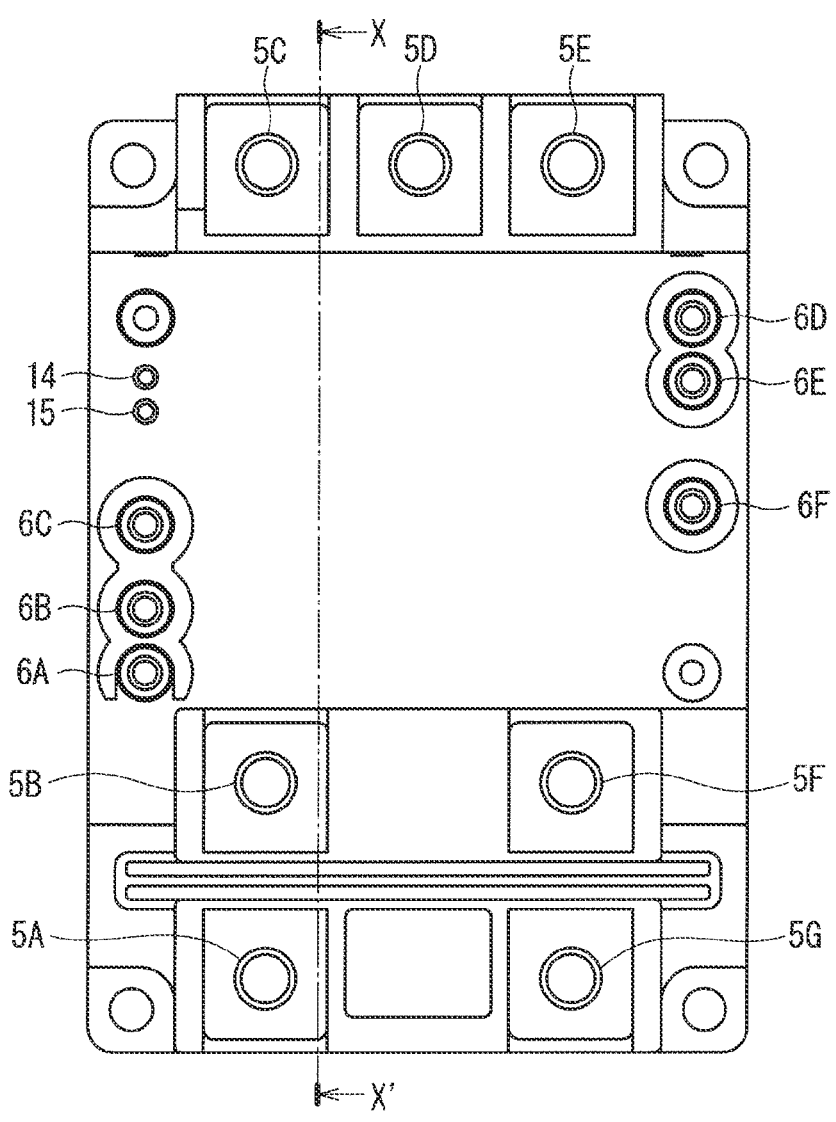

F I G.  3
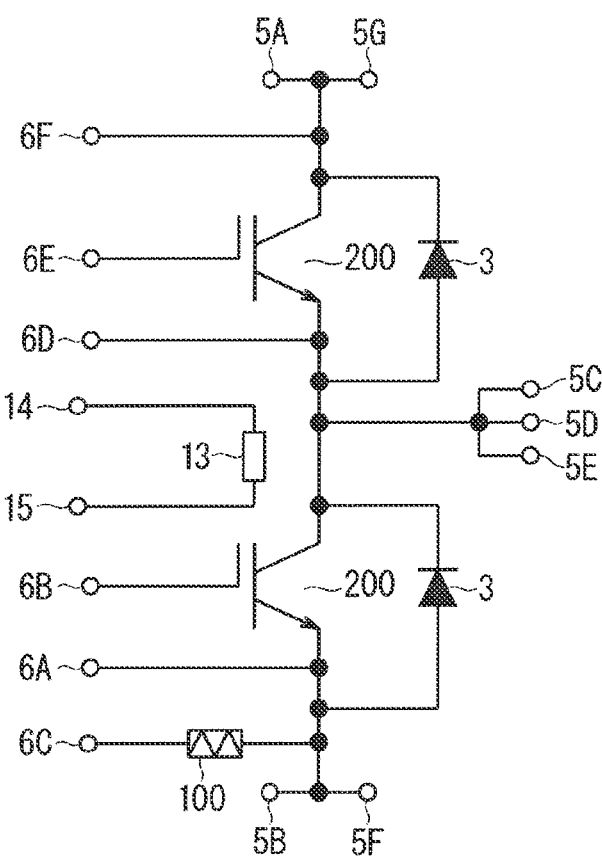

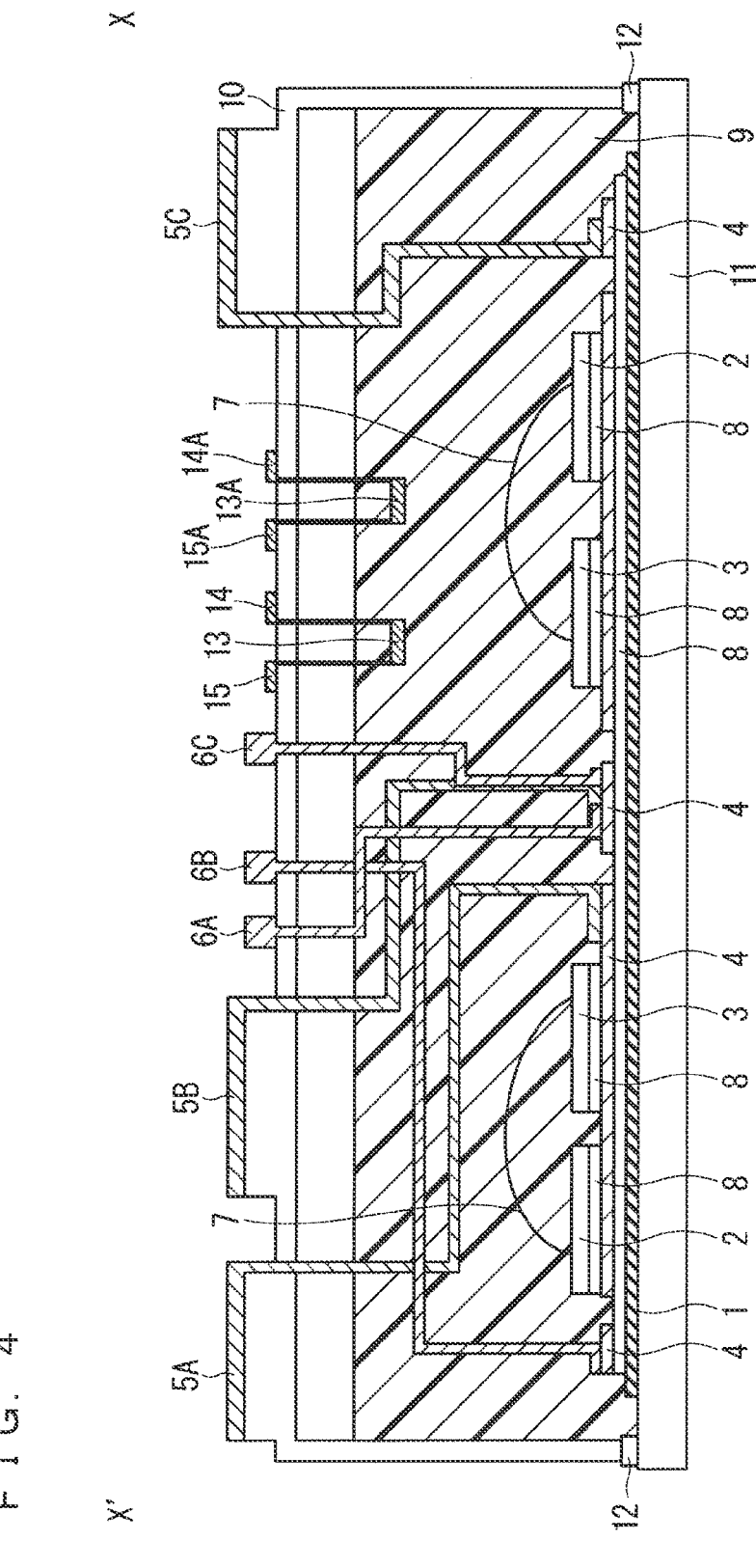
F I G. 4

F I G. 5
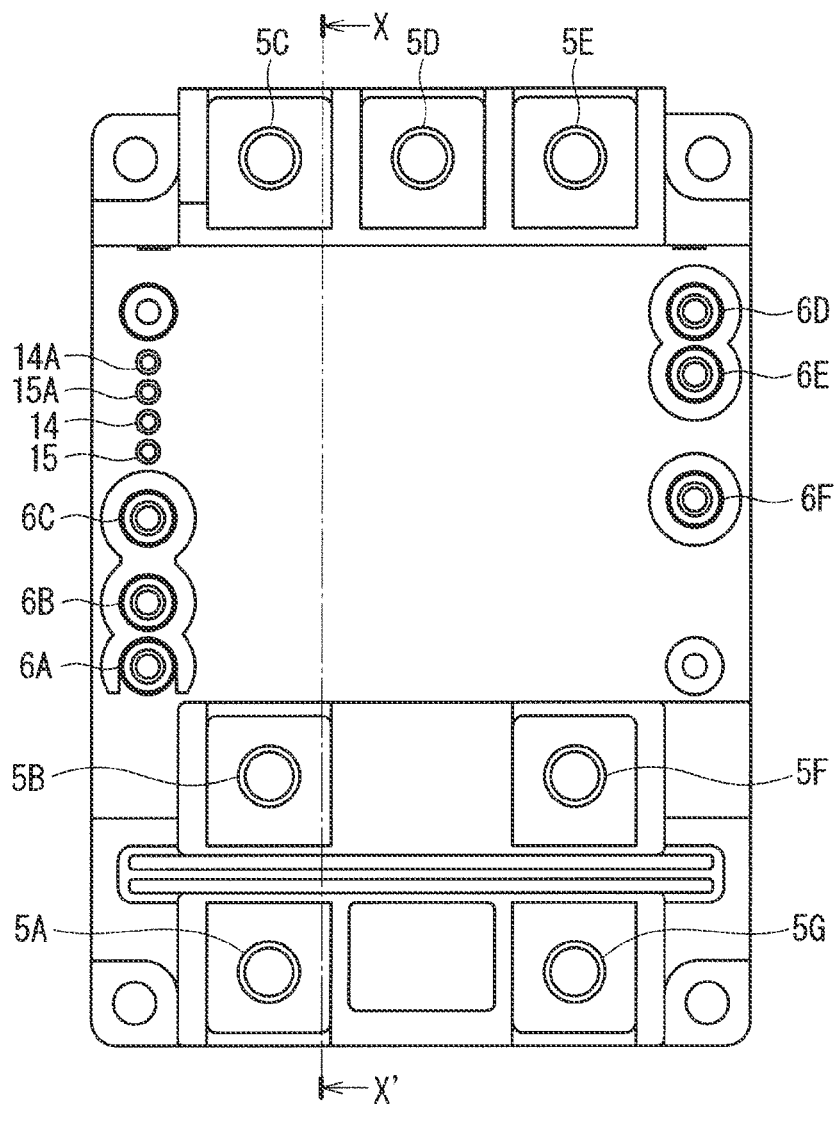

F I G.  6
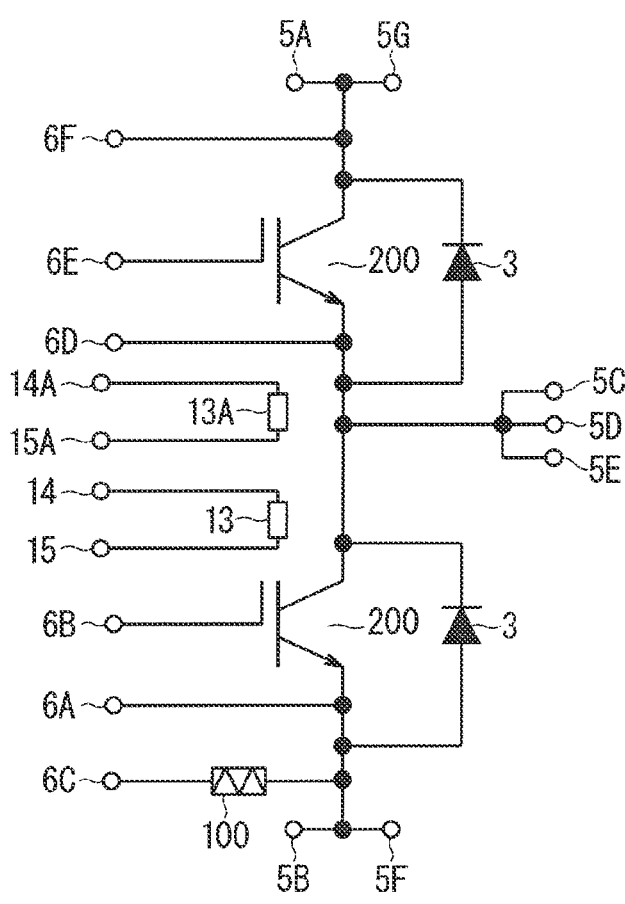

F I G. 8
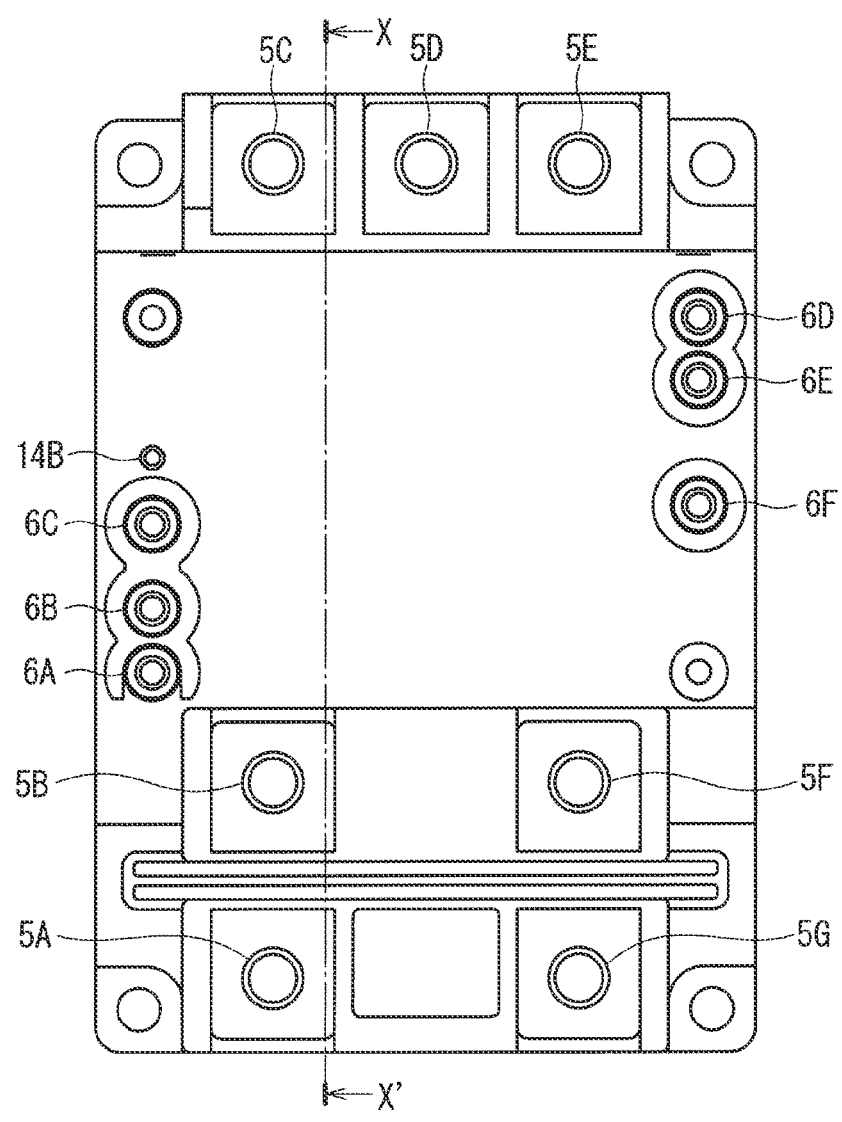

F I G. 9
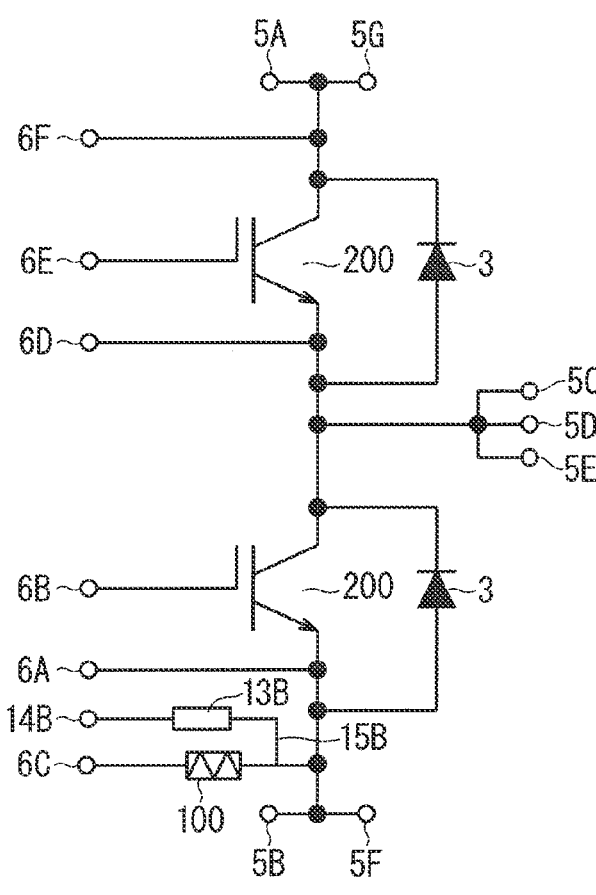

F I G. 1 0
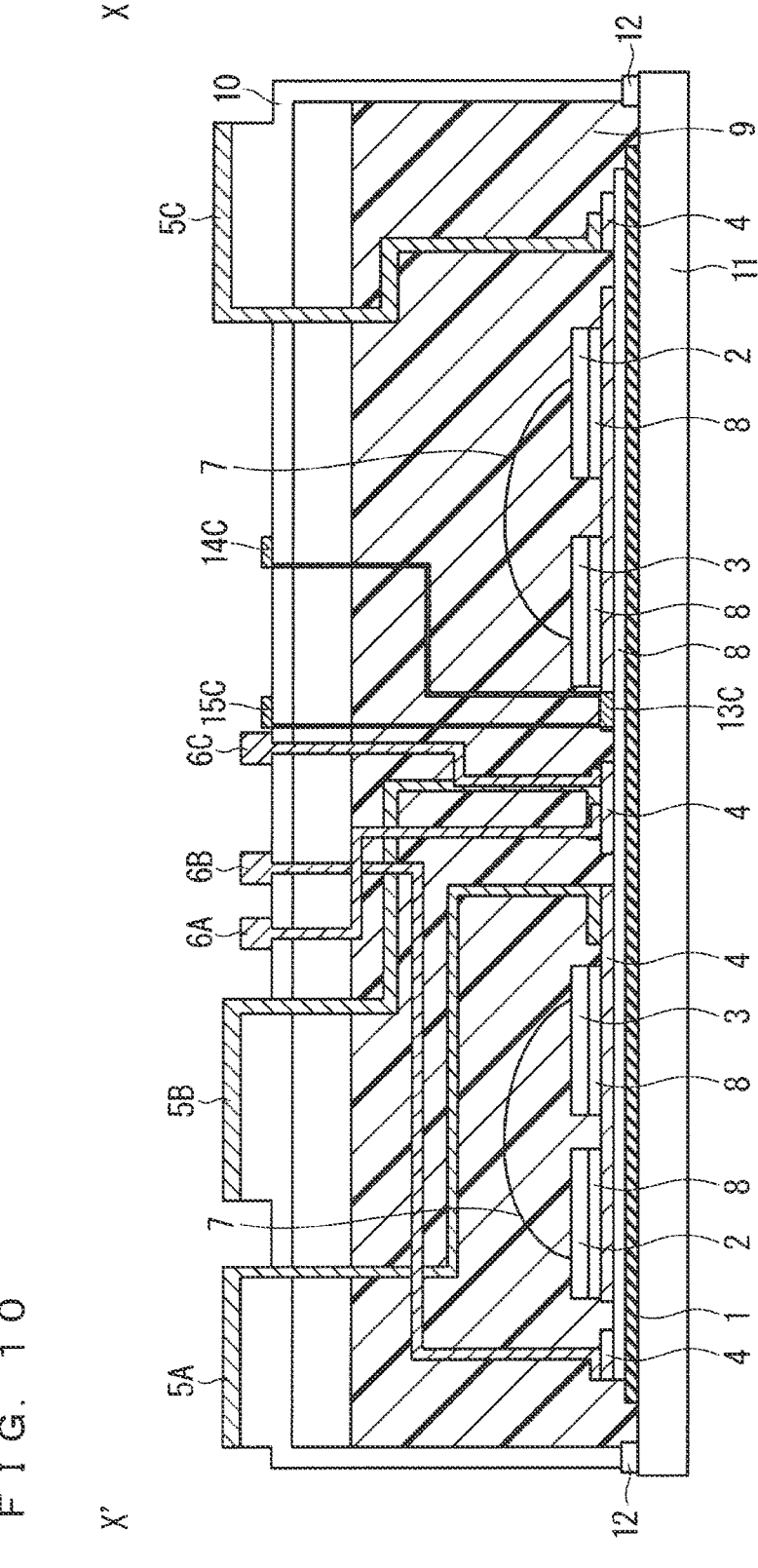

F I G.  1 1
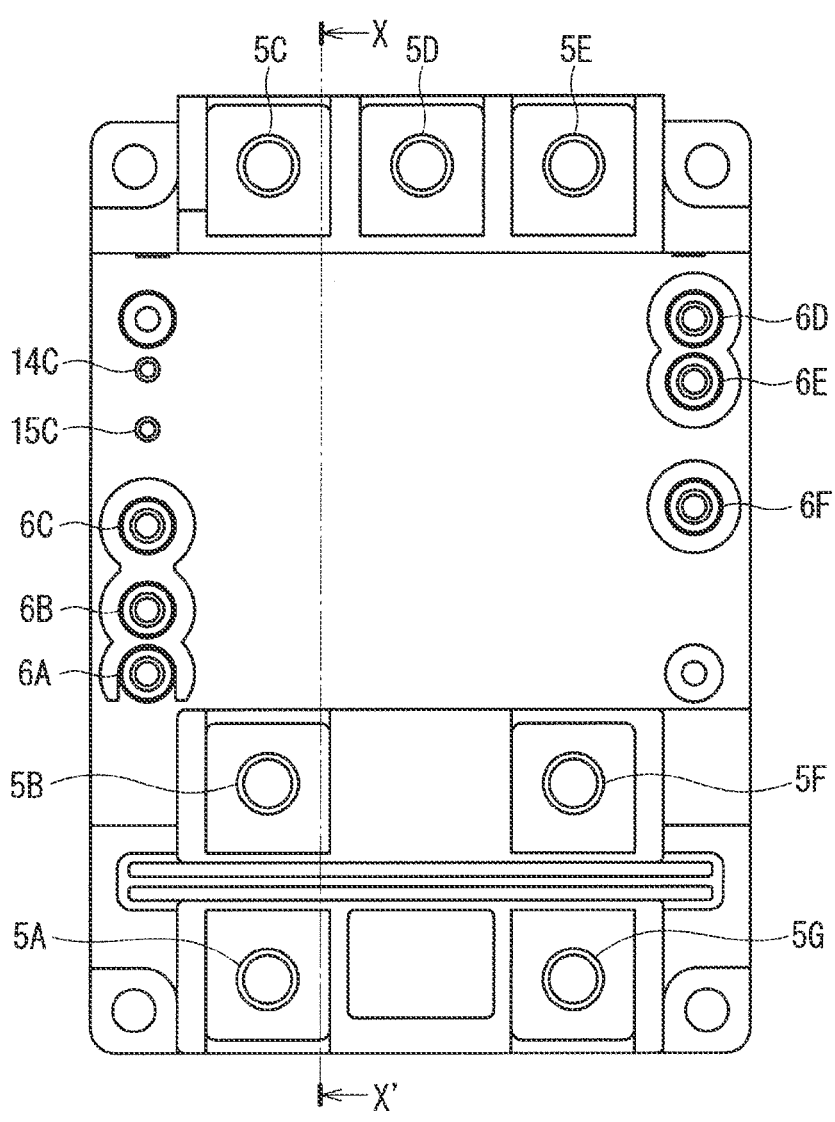

F I G .   1 2
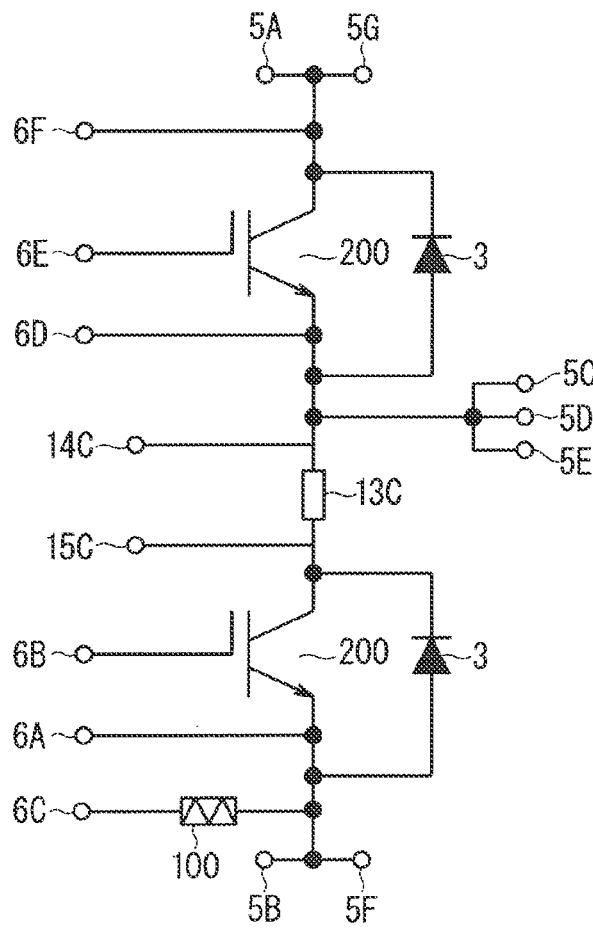

F I G. 1 3
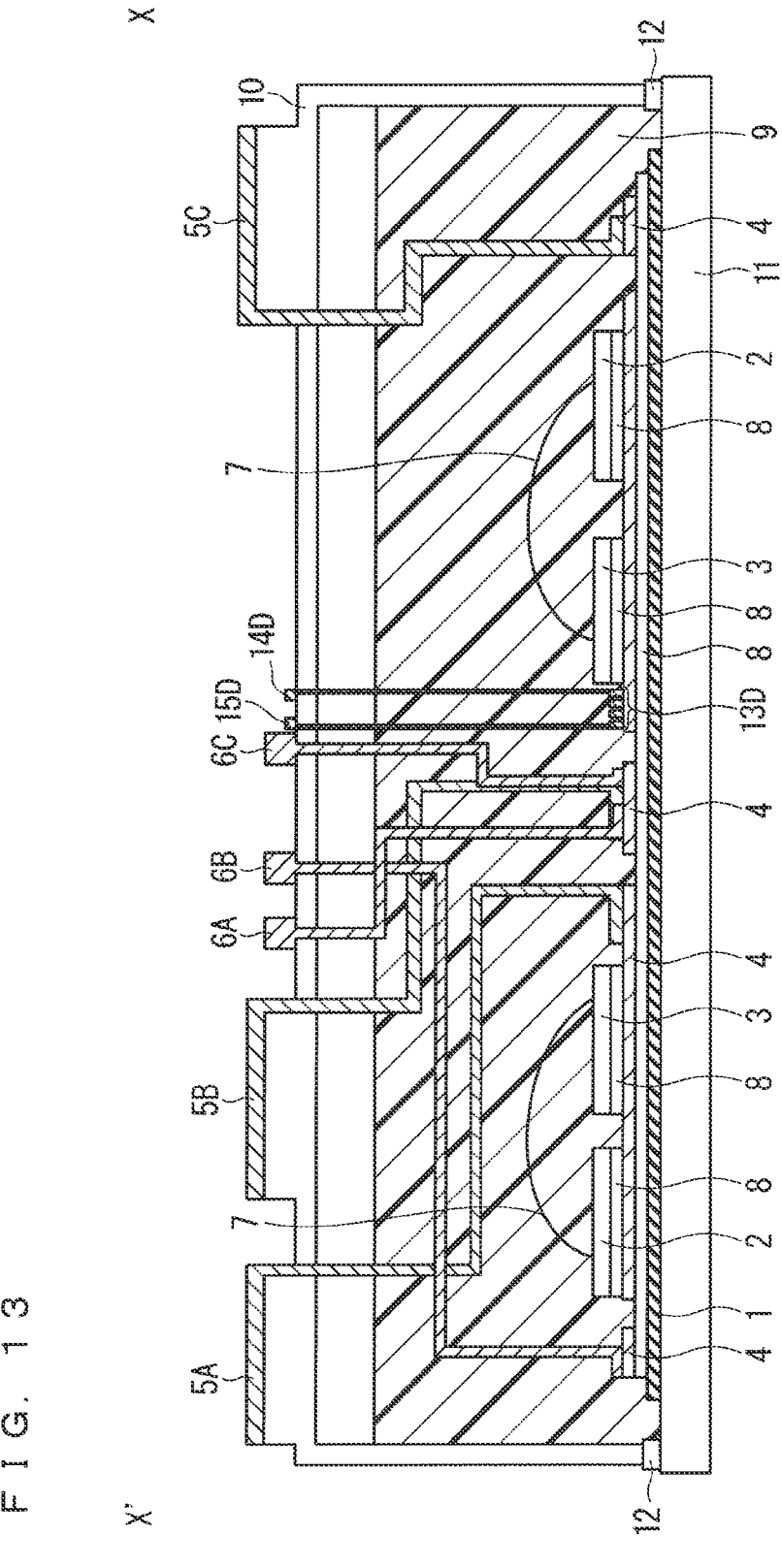

F I G.  1 4
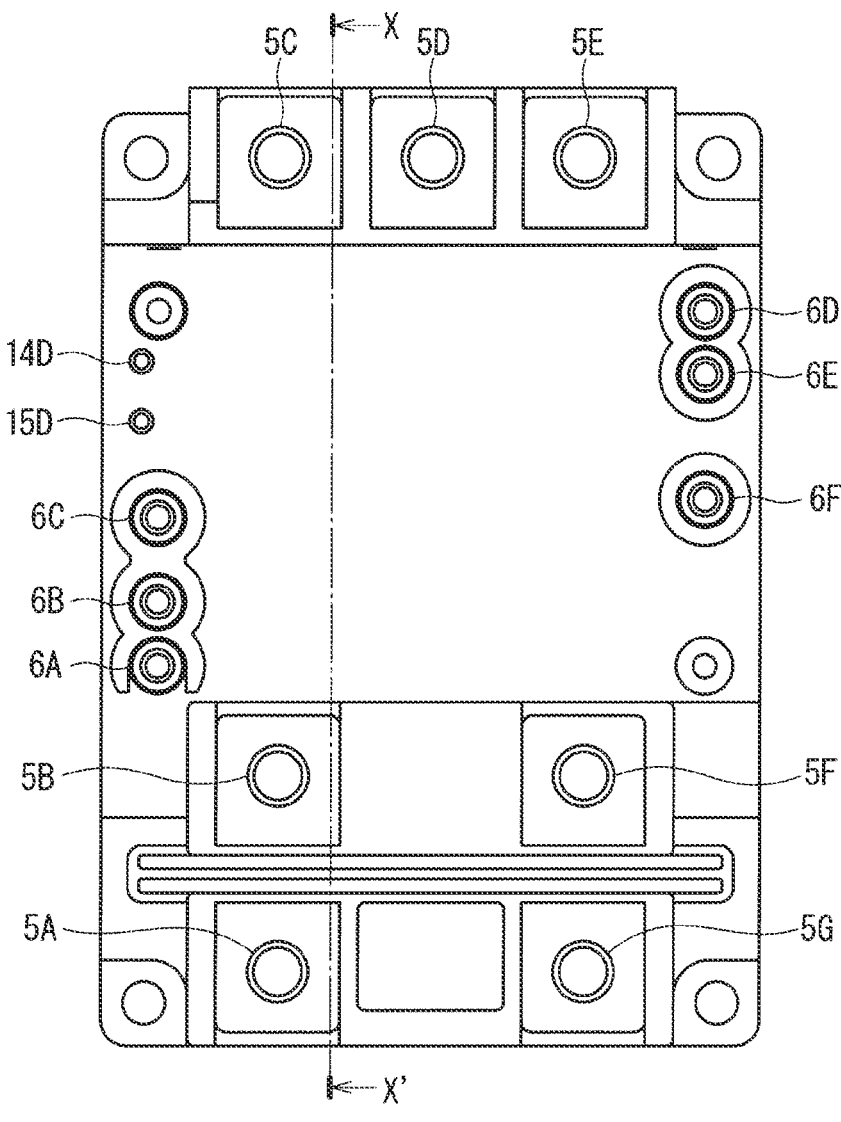

F I G. 1 5
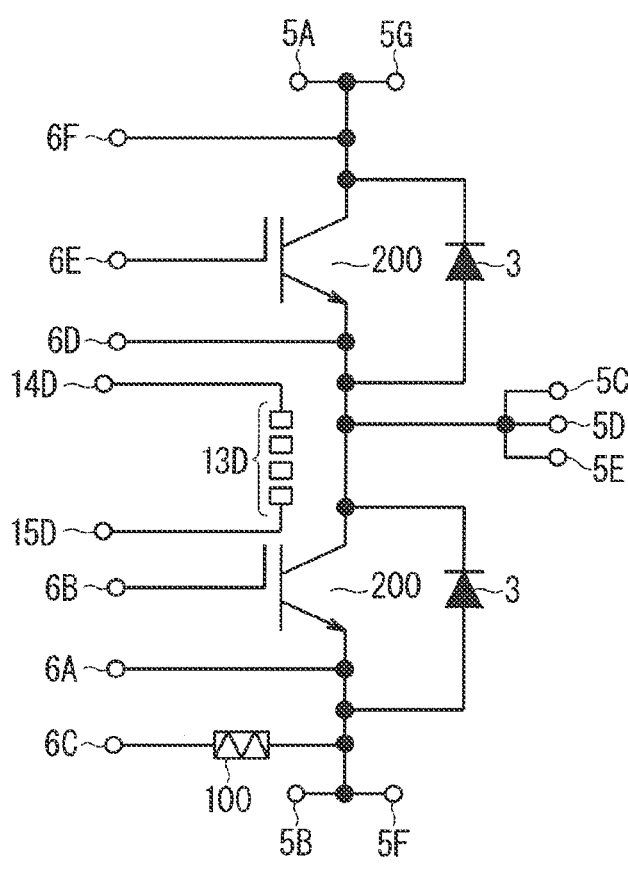

F I G. 1 6
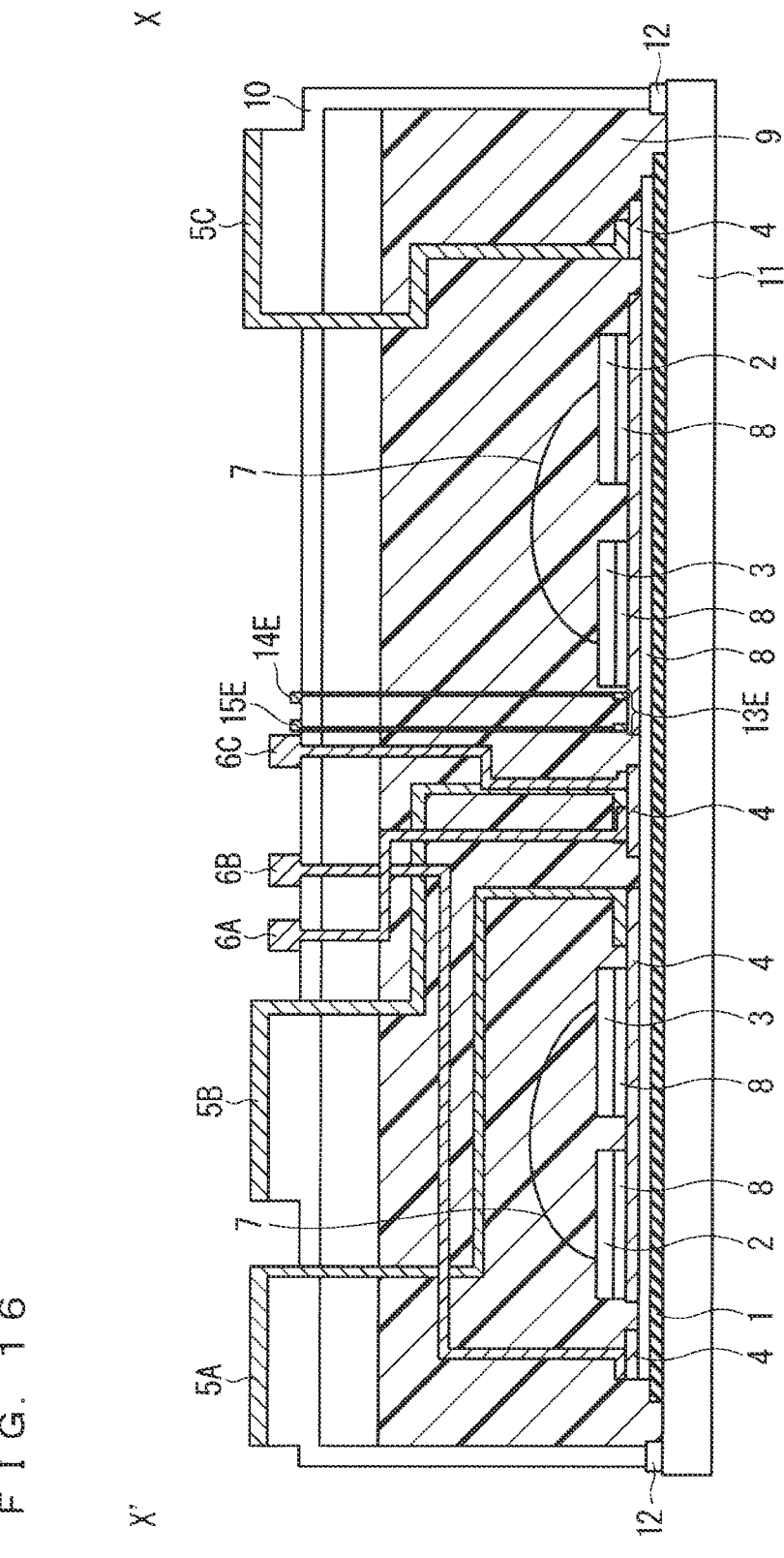

F I G.  1 7
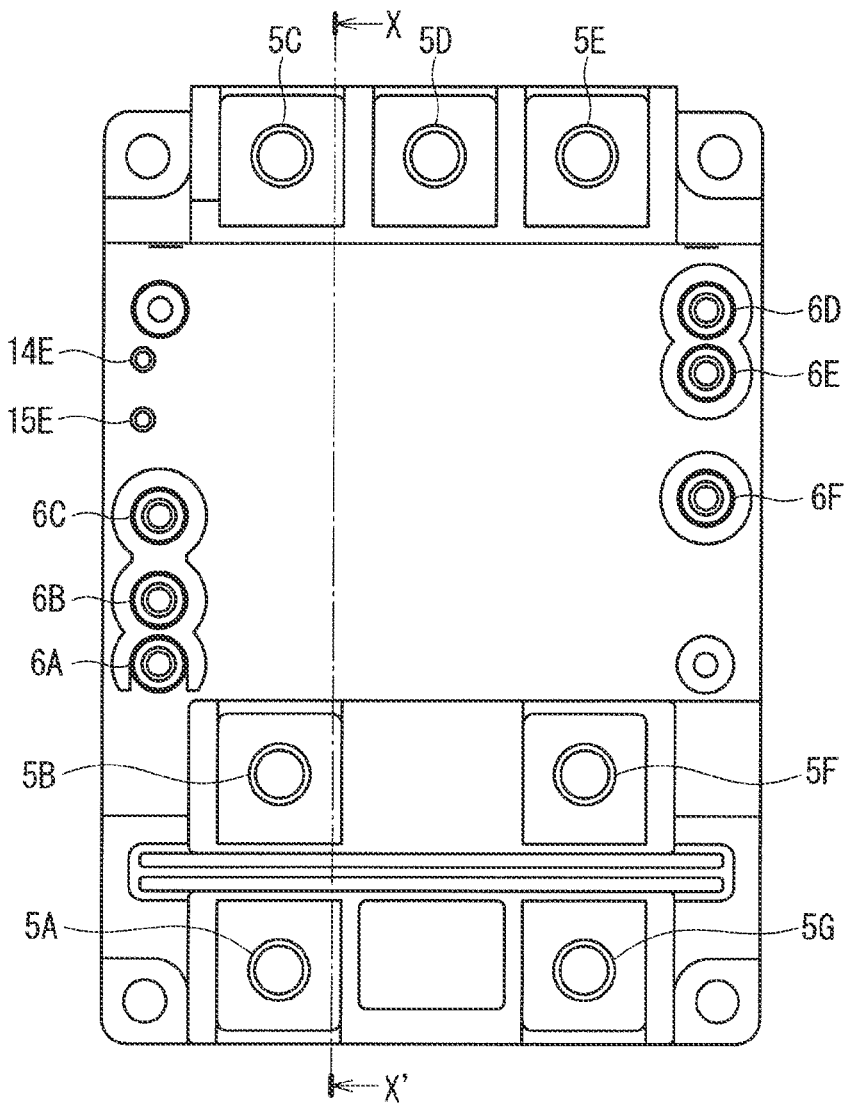

F I G . 1 8
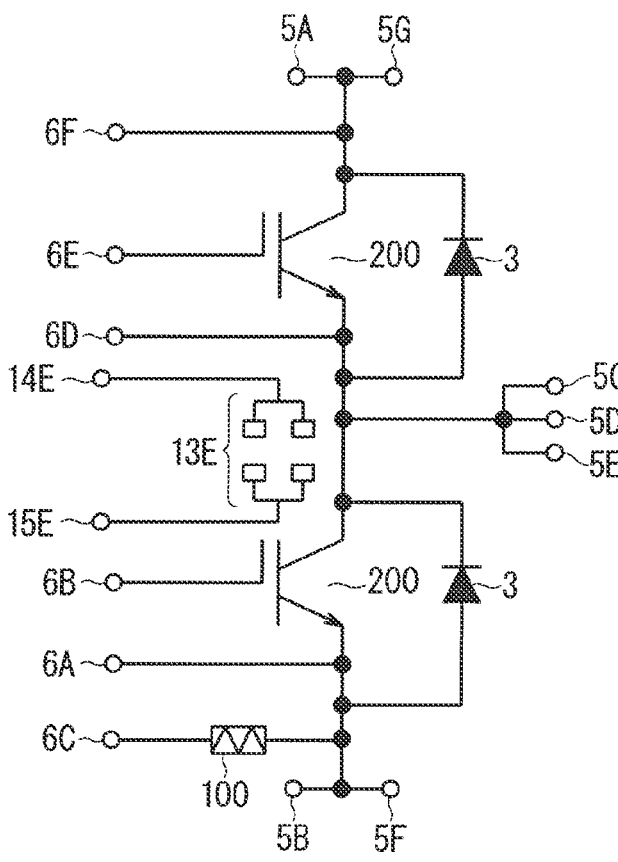

SEMICONDUCTOR DEVICE AND METHOD FOR DIAGNOSING DETERIORATION OF SEMICONDUCTOR DEVICE

TECHNICAL FIELD

A technique disclosed in the present specification relates to a semiconductor device and a method for diagnosing the semiconductor device.

BACKGROUND ART

In some conventional power semiconductor devices, a diagnosis of deterioration due to heat generation or a diagnosis of power cycle life deterioration is performed by using wire wiring inside the power semiconductor device.

Since there is a difference between a linear expansion coefficient of a silicon (Si) chip and a linear expansion coefficient of an aluminum wire, repeated thermal stresses cause deterioration of the aluminum wire. The above deterioration diagnosis can be performed based on a crack generated in the aluminum wire wiring due to the repeated thermal stresses (for example, see Patent Document 1).

PRIOR ART DOCUMENT

Patent Document

Patent Document 1: Japanese Patent Application Laid-Open No. 2009-22084

SUMMARY

Problems to be Solved by the Invention

When the deterioration diagnosis method using the wire wiring as described above is applied to a diagnosis of deterioration due to corrosive gas, there has been the following problem.

That is, since an arrangement of the wire wiring as described above is mainly fixed on an upper surface of a semiconductor chip or the like, it is not always possible to arrange the wire wiring in a place suitable for deterioration diagnosis, for example, a place where deterioration is likely to proceed. Therefore, the accuracy of deterioration diagnosis may be lowered.

A technique disclosed in the present specification has been studied in view of the problem described above, and an object thereof is to provide the technique for increasing the accuracy of deterioration diagnosis in a semiconductor device.

Means to Solve the Problem

A first aspect of the technique disclosed herein includes a case, a semiconductor chip inside the case, a metal wire bonded to an upper surface of the semiconductor chip, at least one test piece inside the case, and a pair of terminals provided outside the case and connected to the test piece. The test piece is separated from the metal wire inside the case.

A second aspect of the technique disclosed in the present specification is a method for diagnosing deterioration of a semiconductor device by using at least one test piece inside the case. The test piece is separated from a metal wire bonded to an upper surface of a semiconductor chip inside the case, and the method includes diagnosing deterioration of the semiconductor device including the semiconductor chip by using a pair of terminals provided outside the case and connected to the test piece.

Effects of the Invention

A first aspect of the technique disclosed herein includes a case, a semiconductor chip inside the case, a metal wire bonded to an upper surface of the semiconductor chip, at least one test piece inside the case, and a pair of terminals provided outside the case and connected to the test piece. The test piece is separated from the metal wire inside the case. According to this configuration, deterioration of the internal configuration of the semiconductor device can be predicted with high accuracy by calculating a fluctuation amount of resistance values of the test piece provided apart from the metal wire inside the case.

A second aspect of the technique disclosed in the present specification is a method for diagnosing deterioration of a semiconductor device by using at least one test piece inside the case. The test piece is separated from a metal wire bonded to an upper surface of a semiconductor chip inside the case, and the method includes diagnosing deterioration of the semiconductor device including the semiconductor chip by using a pair of terminals provided outside the case and connected to the test piece. According to this configuration, deterioration of the internal configuration of the semiconductor device can be predicted with high accuracy by calculating a fluctuation amount of resistance values of the test piece provided apart from the metal wire inside the case.

In addition, objectives, features, aspects, and advantages associated with the present specification disclosed will be further clarified by the detailed description and accompanying drawings set forth below.

BRIEF DESCRIPTION OF DRAWINGS

FIG. 1 is a schematic side view showing an example of a configuration of a semiconductor device according to an embodiment.

FIG. 2 is a top view corresponding to the configuration shown in FIG. 1.

FIG. 3 is a circuit diagram corresponding to the configuration shown in FIG. 1.

FIG. 4 is a schematic side view showing an example of a configuration of a semiconductor device according to an embodiment.

FIG. 5 is a top view corresponding to the configuration shown in FIG. 4.

FIG. 6 is a circuit diagram corresponding to the configuration shown in FIG. 4.

FIG. 8 is a top view corresponding to the configuration shown in FIG. 7.

FIG. 9 is a circuit diagram corresponding to the configuration shown in FIG. 7.

FIG. 10 is a schematic side view showing an example of a configuration of a semiconductor device according to an embodiment.

FIG. 11 is a top view corresponding to the configuration shown in FIG. 10.

FIG. 12 is a circuit diagram corresponding to the configuration shown in FIG. 10.

FIG. 13 is a schematic side view showing an example of a configuration of a semiconductor device according to an embodiment.

FIG. 14 is a top view corresponding to the configuration shown in FIG. 13.

FIG. 15 is a circuit diagram corresponding to the configuration shown in FIG. 13.

FIG. 16 is a schematic side view showing an example of a configuration of a semiconductor device according to an embodiment.

FIG. 17 is a top view corresponding to the configuration shown in FIG. 16.

FIG. 18 is a circuit diagram corresponding to the configuration shown in FIG. 16.

DESCRIPTION OF EMBODIMENTS

Figure 7:
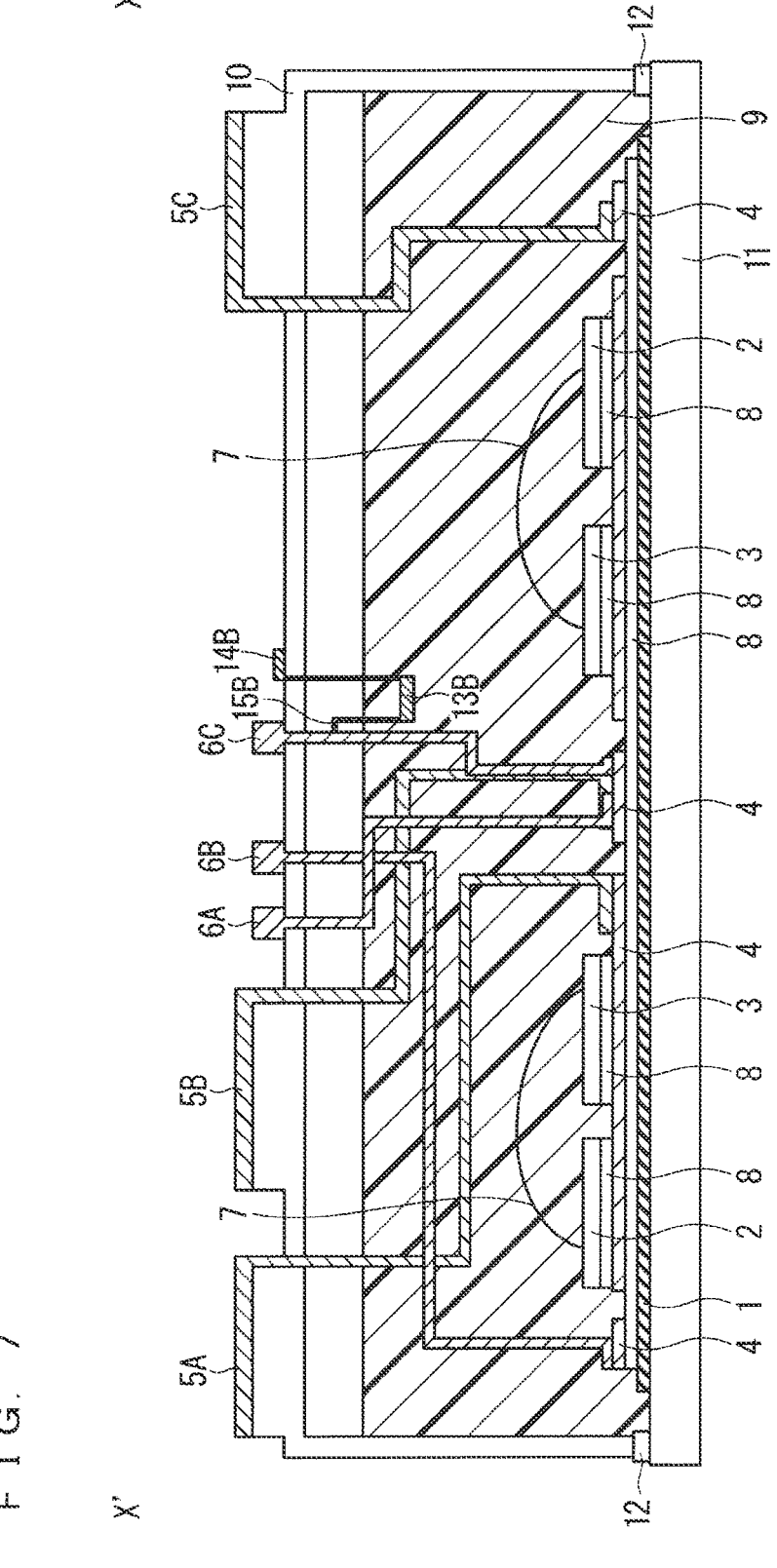
FIG. 7 is a schematic side view showing an example of a configuration of a semiconductor device according to an embodiment.

Hereinafter, embodiments will be described with reference to the attached drawings. In the following embodiments, detailed features and the like are also shown for the purpose of explaining the technique, but they are examples, and not all of them are necessarily essential features in order for the embodiments to be feasible. In addition, examples of effects produced by each of the embodiments will be described together after the description of all embodiments.

It should be noted that the drawings are shown schematically, and for convenience of explanation, configurations are omitted or the configurations are simplified in the drawings as appropriate. Further, an interrelationship between sizes and positions of the configurations and the like shown in different drawings is not always accurately described and can be changed as appropriate. Further, even in a drawing such as a plan view, which is not a cross-sectional view, hatching may be added to facilitate understanding of contents of the embodiments.

Further, in the description shown below, similar components are illustrated with the same reference signs, and their names and functions are also the same. Therefore, detailed description thereof may be omitted to avoid duplication.

Also, in the description described below, even when a specific position and direction, such as "top", "bottom", "left", "right", "side", "bottom", "front" or "back", are used, these terms are used for convenience to facilitate understanding of the contents of the embodiments, and have no relation with directions in which they are actually implemented.

Further, in the description described below, when "upper surface of . . . " or "lower surface of . . . " is described, in addition to the upper surface itself of a target component, the description includes a state in which other component is formed on the upper surface of the target component. In other words, for example, when the description says, "B provided on the upper surface of A", it does not prevent another component "C" from intervening between A and B.

First Embodiment

Hereinafter, a semiconductor device according to the present embodiment and a method for diagnosing the semiconductor device will be described.
(Configuration of Semiconductor Device)

FIG. 1 is a schematic side view showing an example of a configuration of the semiconductor device (for example, a power module) according to the present embodiment. In FIG. 1, a sealing material 9 is partially seen through.

As shown in an example in FIG. 1, the semiconductor device includes an insulating substrate 1 (or an insulating sheet), a conductive bonding material 8 formed on an upper surface of the insulating substrate 1, an electrode pattern 4 formed of a conductive material arranged on an upper surface of the conductive bonding material 8, a metal-oxide-semiconductor field-effect transistor (MOSFET) chip 2 as a semiconductor element arranged on an upper surface of the electrode pattern 4 via the conductive bonding material 8, a Schottky barrier diode (SBD) chip 3 as a semiconductor element arranged on the upper surface of the electrode pattern 4 via the conductive bonding material 8, a metal wire 7 that connects the MOSFET chip 2 and the SBD chip 3, a base plate 11 that is a heat radiating plate connected to a lower surface of the insulating substrate 1, an outsert case 10 that is connected to an upper surface of the base plate 11 via an adhesive 12, surrounds the insulating substrate 1 in a plan view, and covers above the insulating substrate 1, a main electrode terminal 5A, a main electrode terminal 5B, and a main electrode terminal 5C that are connected to the upper surface of the electrode pattern 4 and an outside of the outsert case 10, an auxiliary electrode terminal 6A, an auxiliary electrode terminal 6B, and an auxiliary electrode terminal 6C that are connected to the upper surface of the electrode pattern 4 and the outside of the outsert case 10, a terminal 14 and a terminal 15 that are mounted on an upper surface of the outsert case 10, a test piece 13 that is extended from the terminal 14 and the terminal 15 and provided inside the outsert case 10, and a sealing material 9 filled inside the outsert case 10.

Note that FIG. 1 shows a case where two MOSFET chips 2 and two SBD chips 3 are mounted inside the outsert case 10.

Further, the sealing material 9 is, for example, a silicon gel, an elastomer, an epoxy resin, or the like.

Here, the electrode pattern 4 in FIG. 1 is formed in a wiring shape by etching a copper (Cu) plate brazed on the upper surface of the insulating substrate 1. However, the electrode pattern 4 may be formed of aluminum (Al), or a surface of copper (Cu) wiring may be plated with nickel (Ni).

Further, the insulating substrate 1 in FIG. 1 is an insulating member formed of AlN. However, the insulating substrate 1 may also be formed of, for example, $Al_2O_3$ or $Si_3N_4$.

Further, the MOSFET chip 2 as the semiconductor element may be, for example, an insulated gate bipolar transistor (IGBT) or a free-wheeling diode (FWD).

A semiconductor used for the semiconductor element may be selected from those using silicon (Si), silicon carbide (SiC), gallium nitride (GaN), or the like as a base material.

The metal wire 7 is, for example, an Al wire having a diameter ($\varphi$) of 400 $\mu$m. However, the metal wire 7 may be, for example, an aluminum (Al) alloy wiring, a plate-shaped aluminum (Al) plate, or a copper (Cu) metal wire having good electric conductivity.

Solder is generally used for the conductive bonding material 8. However, a sintered body formed of fine silver (Ag) particles having a particle diameter of about several nm may be used for the conductive bonding material 8 to support high temperature operation. Further, in a semiconductor device for small current applications, a conductive adhesive containing a conductive filler may be used for the conductive bonding material 8.

The insulating substrate 1 may be bonded to the upper surface of the base plate 11 via the conductive bonding material 8. Further, the insulating substrate 1 may be integrally formed with the base plate 11.

A material of the base plate 11 may be, for example, a composite material of Al and ceramics, such as Al—SiC, or a plate-shaped copper (Cu) plate.

The present embodiment discloses a 2-in-1 type in which the MOSFET chip 2 and the SBD chip 3 are mounted inside the outsert case 10, but a 1-in-1 type in which one element is mounted inside the outsert case 10, a 4-in-1 type in which 4 elements are mounted inside the outsert case 10, a 6-in-1 type in which 6 elements are mounted inside the outsert case 10, a 12-in-1 in which 12 elements are mounted inside the outsert case 10, or the like is also applicable.

The test piece 13 for deterioration observation is embedded inside the outsert case 10 of the semiconductor device. Then, the terminals 14 and 15 for resistance observation connected to both ends of the test piece 13 are exposed to the outside of the outsert case 10 in the same manner as the auxiliary electrode terminals.

The test piece 13 for deterioration observation is mainly formed of silver (Ag) or copper (Cu) having good corrosion sensitivity. However, depending on a combination with a gas used for corrosion, the test piece 13 for deterioration observation may be formed of nickel (Ni), aluminum (Al), or other metals.

Further, although it is desirable that a purity of the metal configuring the test piece 13 for deterioration observation is high, the purity may be matched with a purity or property of other members used in the semiconductor device.

Here, FIG. 2 is a top view corresponding to the configuration shown in FIG. 1. FIG. 1 corresponds to a side view of an X-X' plane in FIG. 2.

As shown in FIG. 2, in the semiconductor device, the main electrode terminal 5A on a P side, the main electrode terminal 5B on an N side, the main electrode terminal 5C of an AC electrode, a main electrode terminal 5D of the AC electrode, a main electrode terminal 5E of the AC electrode, a main electrode terminal 5F on the N side, a main electrode terminal 5G on the P side, the auxiliary electrode terminal 6A that is an emitter terminal of the MOSFET chip 2, the auxiliary electrode terminal 6B that is a gate terminal of the MOSFET chip 2, the auxiliary electrode terminal 6C that is connected to a thermistor (not shown here), an auxiliary electrode terminal 6D that is an emitter terminal of the MOSFET chip 2, an auxiliary electrode terminal 6E that is a gate terminal of the MOSFET chip 2, an auxiliary electrode terminal 6F that is a collector terminal of the MOSFET chip 2, the terminal 14, and the terminal 15 are provided protruding from the upper surface of the outsert case 10.

Further, FIG. 3 is a circuit diagram corresponding to the configuration shown in FIG. 1. However, in FIG. 3, the MOSFET chip in FIG. 1 is replaced with an IGBT chip.

As shown in FIG. 3, the semiconductor device includes two IGBT chips 200 connected in series with each other, SBD chips 3 respectively connected in parallel with the IGBT chips 200, the main electrode terminal 5C, the main electrode terminal 5D, and the main electrode terminal 5E that are connected between the two IGBT chips 200, the main electrode terminal 5A and the main electrode terminal 5G that are connected to a collector side of one IGBT chip 200, the auxiliary electrode terminal 6F connected between one IGBT chip 200 and the main electrode terminal 5A and main electrode terminal 5G, the auxiliary electrode terminal 6E connected to a gate side of one IGBT chip 200, the auxiliary electrode terminal 6D connected to an emitter side of one IGBT chip 200, the auxiliary electrode terminal 6B connected to a gate side of the other IGBT chip 200, the main electrode terminal 5B and the main electrode terminal 5F that are connected to an emitter side of the other IGBT chip 200, the thermistor 100 connected between the other IGBT chip 200 and the main electrode terminal 5B and main electrode terminal 5F, the auxiliary electrode terminal 6C connected to the thermistor 100, the auxiliary electrode terminal 6A connected between the other IGBT chip 200 and the thermistor 100, and a test piece 13 whose both ends are connected to the terminal 14 and the terminal 15 without being connected to other wiring.

(Deterioration Diagnosis of Semiconductor Device)

During an initial use and maintenance of the semiconductor device, a resistance value between the terminal 14 and the terminal 15 is measured. Then, a fluctuation amount of the resistance values is calculated by comparing the resistance value at the time of initial use with the resistance value at the time of maintenance.

Further, from the fluctuation amount of the resistance values, a degree of corrosion in the configuration of the metal wire 7, the main electrode terminals, the auxiliary electrode terminals, and the like mounted inside the outsert case 10, or a degree of deterioration and discoloration of the sealing material 9 is predicted.

Second Embodiment

A semiconductor device according to the present embodiment and a method for diagnosing the semiconductor device will be described. In the following description, components similar to the components described in the above-described embodiment will be illustrated with the same reference signs, and detailed description thereof will be omitted as appropriate.

(Configuration of Semiconductor Device)

FIG. 4 is a schematic side view showing an example of the configuration of the semiconductor device according to the present embodiment. In FIG. 4, the sealing material 9 is partially seen through.

As shown in FIG. 4, the semiconductor device includes the insulating substrate 1, the conductive bonding material 8, the electrode pattern 4, MOSFET chip 2, the SBD chip 3, the metal wire 7, the base plate 11, the outsert case 10, the main electrode terminal 5A, the main electrode terminal 5B, the main electrode terminal 5C, the auxiliary electrode terminal 6A, the auxiliary electrode terminal 6B, the auxiliary electrode terminal 6C, the terminal 14, the terminal 15, the test piece 13, a terminal 14A and a terminal 15A that are mounted on the upper surface of the outsert case 10 at positions different from the terminal 14 and the terminal 15, a test piece 13A that is extended from the terminal 14A and the terminal 15A and provided inside the outsert case 10, and the sealing material 9.

The same type or different types of metal may be used for the test piece 13 and the test piece 13A.

Here, FIG. 5 is a top view corresponding to the configuration shown in FIG. 4. FIG. 4 corresponds to a side view of an X-X' plane in FIG. 5.

As shown in FIG. 5, in the semiconductor device, the main electrode terminal 5A on the P side, the main electrode terminal 5B on the N side, the main electrode terminal 5C of the AC electrode, the main electrode terminal 5D of the AC electrode, the main electrode terminal 5E of the AC electrode, the main electrode terminal 5F on the N side, the main electrode terminal 5G on the P side, the auxiliary electrode terminal 6A, the auxiliary electrode terminal 6B, the auxiliary electrode terminal 6C, the auxiliary electrode terminal 6D, the auxiliary electrode terminal 6E, the auxiliary electrode terminal 6F, the terminal 14, the terminal 15, the terminal 14A, and the terminal ISA are provided protruding from the upper surface of the outsert case 10.

Further, FIG. 6 is a circuit diagram corresponding to the configuration shown in FIG. 4. However, in FIG. 6, the MOSFET chip in FIG. 4 is replaced with an IGBT chip.

As shown in FIG. 6, the semiconductor device includes two IGBT chips 200, two SBD chips 3, the main electrode terminal 5C, the main electrode terminal 5D, the main electrode terminal 5E, the main electrode terminal 5A, the main electrode terminal 5G, the auxiliary electrode terminal 6F, the auxiliary electrode terminal 6E, the auxiliary electrode terminal 6D, the auxiliary electrode terminal 6B, the main electrode terminal 5B, the main electrode terminal 5F, the thermistor 100, the auxiliary electrode terminal 6C, the auxiliary electrode terminal 6A, the test piece 13, and the test piece 13A whose both ends are connected to the terminal 14A and the terminal 15A without being connected to other wiring.

(Deterioration Diagnosis of Semiconductor Device)

During an initial use and maintenance of the semiconductor device, a resistance value between the terminal 14 and the terminal 15 and a resistance value between the terminal 14A and the terminal ISA are measured. Then, a fluctuation amount of the resistance values is respectively calculated by comparing the resistance value at the time of initial use with the resistance value at the time of maintenance.

Further, from the fluctuation amount of the resistance values, a degree of corrosion in the configuration of the metal wire 7, the main electrode terminals, the auxiliary electrode terminals, and the like mounted inside the outsert case 10, or a degree of deterioration and discoloration of the sealing material 9 is predicted.

A gas that easily reacts differs by a type of metal used for the test piece 13 and the test piece 13A. Therefore, by using two or more different metals for each of the test piece 13 and the test piece 13A, a diagnostic sensitivity to a plurality of types of gases can be enhanced.

For example, silver (Ag), copper (Cu), or nickel (Ni) show deterioration against sulfur-based and nitriding-based components. Therefore, the test piece 13 or the test piece 13A formed of these metals is effective for diagnosing deterioration of sulfide-based or nitriding-based conductive products.

When the same type of metal is used for the test piece 13 and the test piece 13A, and the test pieces are placed in two or more places with different magnitudes of influence of corrosion gas, for example, a place with high sensitivity such as a surface side close to the outside and a place with low sensitivity such as a further inner side, an index for confirming a corrosion reaction rate or a degree of progress of internal corrosion can be created based on a difference in the resistance values measured from a plurality of test pieces.

Third Embodiment

A semiconductor device according to the present embodiment and a method for diagnosing the semiconductor device will be described. In the following description, components similar to the components described in the above-described embodiment will be illustrated with the same reference signs, and detailed description thereof will be omitted as appropriate.

(Configuration of Semiconductor Device)

FIG. 7 is a schematic side view showing an example of the configuration of the semiconductor device according to the present embodiment. In FIG. 7, the sealing material 9 is partially seen through.

As shown in FIG. 7, the semiconductor device includes the insulating substrate 1, the conductive bonding material 8, the electrode pattern 4, MOSFET chip 2, the SBD chip 3, the metal wire 7, the base plate 11, the outsert case 10, the main electrode terminal 5A, the main electrode terminal 5B, the main electrode terminal 5C, the auxiliary electrode terminal 6A, the auxiliary electrode terminal 6B, the auxiliary electrode terminal 6C, a terminal 14B mounted on the upper surface of the outsert case 10, a terminal 15B connected to the auxiliary electrode terminal 6C, a test piece 13B that is extended from the terminal 14B and the terminal 15B and provided inside the outsert case 10, and the sealing material 9.

In FIG. 7, the terminal 15B is connected to the auxiliary electrode terminal 6C, which is an existing terminal, to be shared. However, the terminal 14B or both the terminal 14B and the terminal 15B may be shared with the existing terminal.

Here, FIG. 8 is a top view corresponding to the configuration shown in FIG. 7. FIG. 7 corresponds to a side view of an X-X' plane in FIG. 8.

As shown in FIG. 8, in the semiconductor device, the main electrode terminal 5A on the P side, the main electrode terminal 5B on the N side, the main electrode terminal 5C of the AC electrode, the main electrode terminal 5D of the AC electrode, the main electrode terminal 5E of the AC electrode, the main electrode terminal 5F on the N side, the main electrode terminal 5G on the P side, the auxiliary electrode terminal 6A, the auxiliary electrode terminal 6B, the auxiliary electrode terminal 6C, the auxiliary electrode terminal 6D, the auxiliary electrode terminal 6E, the auxiliary electrode terminal 6F, and the terminal 14B are provided protruding from the upper surface of the outsert case 10.

Further, FIG. 9 is a circuit diagram corresponding to the configuration shown in FIG. 7. However, in FIG. 9, the MOSFET chip in FIG. 7 is replaced with an IGBT chip.

As shown in FIG. 9, the semiconductor device includes two IGBT chips 200, two SBD chips 3, the main electrode terminal 5C, the main electrode terminal 5D, the main electrode terminal 5E, the main electrode terminal 5A, the main electrode terminal 5G, the auxiliary electrode terminal 6F, the auxiliary electrode terminal 6E, the auxiliary electrode terminal 6D, the auxiliary electrode terminal 6B, the main electrode terminal 5B, the main electrode terminal 5F, the thermistor 100, the auxiliary electrode terminal 6C, the auxiliary electrode terminal 6A, the terminal 15B connected between the other IGBT chip 200 and the main electrode terminal 5B and main electrode terminal 5F, the test piece 13B connected to the terminal 15B, and the terminal 14B connected to the test piece 13B.

(Deterioration Diagnosis of Semiconductor Device)

During an initial use and maintenance of the semiconductor device, a resistance value between the auxiliary electrode terminal 6C and the terminal 14B is measured. Then, a fluctuation amount of the resistance values is calculated by comparing the resistance value at the time of initial use with the resistance value at the time of maintenance.

According to the semiconductor device of the present embodiment, the deterioration diagnosis can be performed by using the existing terminal. Thus, the deterioration diagnosis can be performed while suppressing an additional configuration of the semiconductor device. In addition, since the existing terminal is used for performing measurement for deterioration diagnosis, the measurement can be performed efficiently.

Fourth Embodiment

A semiconductor device according to the present embodiment and a method for diagnosing the semiconductor device will be described. In the following description, components similar to the components described in the above-described embodiment will be illustrated with the same reference signs, and detailed description thereof will be omitted as appropriate.
(Configuration of Semiconductor Device)

FIG. 10 is a schematic side view showing an example of the configuration of the semiconductor device according to the present embodiment. In FIG. 10, the sealing material 9 is partially seen through.

As shown in FIG. 10, the semiconductor device includes the insulating substrate 1, the conductive bonding material 8, the electrode pattern 4, MOSFET chip 2, the SBD chip 3, the metal wire 7, the base plate 11, the outsert case 10, the main electrode terminal 5A, the main electrode terminal 5B, the main electrode terminal 5C, the auxiliary electrode terminal 6A, the auxiliary electrode terminal 6B, the auxiliary electrode terminal 6C, a terminal 14C mounted on the upper surface of the outsert case 10, a terminal 15C mounted on the upper surface of the outsert case 10, a test piece 13C integrally provided with the electrode pattern 4 inside the outsert case 10 from the terminal 14C and the terminal 15C, and the sealing material 9.

In FIG. 10, the terminal 14C and the terminal 15C are provided separately from the existing terminal. However, for example, as shown in the third embodiment, at least one of the terminal 14C and the terminal 15C may be shared with other terminal.

Here, FIG. 11 is a top view corresponding to the configuration shown in FIG. 10. FIG. 10 corresponds to a side view of an X-X' plane in FIG. 11.

As shown in FIG. 11, in the semiconductor device, the main electrode terminal 5A on the P side, the main electrode terminal 5B on the N side, the main electrode terminal 5C of the AC electrode, the main electrode terminal 5D of the AC electrode, the main electrode terminal 5E of the AC electrode, the main electrode terminal 5F on the N side, the main electrode terminal 5G on the P side, the auxiliary electrode terminal 6A, the auxiliary electrode terminal 6B, the auxiliary electrode terminal 6C, the auxiliary electrode terminal 6D, the auxiliary electrode terminal 6E, the auxiliary electrode terminal 6F, the terminal 14C, and the terminal 15C are provided protruding from the upper surface of the outsert case 10.

Further, FIG. 12 is a circuit diagram corresponding to the configuration shown in FIG. 10. However, in FIG. 12, the MOSFET chip in FIG. 10 is replaced with an IGBT chip.

As shown in FIG. 12, the semiconductor device includes two IGBT chips 200, two SBD chips 3, the main electrode terminal 5C, the main electrode terminal 5D, the main electrode terminal 5E, the main electrode terminal 5A, the main electrode terminal 5G, the auxiliary electrode terminal 6F, the auxiliary electrode terminal 6E, the auxiliary electrode terminal 6D, the auxiliary electrode terminal 6B, the main electrode terminal 5B, the main electrode terminal 5F, the thermistor 100, the auxiliary electrode terminal 6C, the auxiliary electrode terminal 6A, the test piece 13C connected between the two IGBT chips 200, and the terminal 14C and the terminal 15C connected to both ends of the test piece 13C.
(Deterioration Diagnosis of Semiconductor Device)

During an initial use and maintenance of the semiconductor device, a resistance value between the terminal 14C and the terminal 15C is measured. Then, a fluctuation amount of the resistance values is calculated by comparing the resistance value at the time of initial use with the resistance value at the time of maintenance.

According to the semiconductor device of the present embodiment, since the electrode pattern 4 can also be used as the test piece 13C to perform the deterioration diagnosis, the deterioration diagnosis can be performed while suppressing an additional configuration of the semiconductor device. Therefore, it is possible to suppress an increase in the manufacturing cost of the semiconductor device. In addition, corrosion in the electrode pattern 4, which tends to cause a defect in the semiconductor device, can be recognized quickly.

Fifth Embodiment

A semiconductor device according to the present embodiment and a method for diagnosing the semiconductor device will be described. In the following description, components similar to the components described in the above-described embodiment will be illustrated with the same reference signs, and detailed description thereof will be omitted as appropriate.
(Configuration of Semiconductor Device)

FIG. 13 is a schematic side view showing an example of the configuration of the semiconductor device according to the present embodiment. In FIG. 13, the sealing material 9 is partially seen through.

As shown in FIG. 13, the semiconductor device includes the insulating substrate 1, the conductive bonding material 8, the electrode pattern 4, MOSFET chip 2, the SBD chip 3, the metal wire 7, the base plate 11, the outsert case 10, the main electrode terminal 5A, the main electrode terminal 5B, the main electrode terminal 5C, the auxiliary electrode terminal 6A, the auxiliary electrode terminal 6B, the auxiliary electrode terminal 6C, a terminal 14D mounted on the upper surface of the outsert case 10, a terminal 15D mounted on the upper surface of the outsert case 10, a test piece 13D that is extended from the terminal 14D and the terminal 15D and provided on the upper surface of the electrode pattern 4 inside the outsert case 10, and the sealing material 9.

In FIG. 13, the terminal 14D and the terminal 15D are provided separately from the existing terminal. However, for example, as shown in the third embodiment, at least one of the terminal 14D and the terminal 15D may be shared with other terminal.

The test piece 13D is formed of a plurality of metal pieces. Further, each of the metal piece is formed of any one of a plurality of types of metals. For example, adjacent metal pieces in the plurality of metal pieces arranged in series are configured with different metals.

Further, the plurality of metal pieces of the test piece 13D are respectively arranged at positions insulated from each other on the upper surface of the electrode pattern 4.

Then, the terminal 14D and the terminal 15D are respectively connected to the metal pieces located at the farthest distance among the plurality of metal pieces configuring the test piece 13D.

Although the test piece 13D is arranged on the upper surface of the electrode pattern 4 in FIG. 13, the test piece 13D may be arranged separated from the electrode pattern 4.

Further, a plurality of test pieces 13D may be provided.

Here, FIG. 14 is a top view corresponding to the configuration shown in FIG. 13. FIG. 13 corresponds to a side view of an X-X' plane in FIG. 14

As shown in FIG. 14, in the semiconductor device, the main electrode terminal 5A on the P side, the main electrode terminal 5B on the N side, the main electrode terminal 5C of the AC electrode, the main electrode terminal 5D of the AC electrode, the main electrode terminal 5E of the AC electrode, the main electrode terminal 5F on the N side, the main electrode terminal 5G on the P side, the auxiliary electrode terminal 6A, the auxiliary electrode terminal 6B, the auxiliary electrode terminal 6C, the auxiliary electrode terminal 6D, the auxiliary electrode terminal 6E, the auxiliary electrode terminal 6F, the terminal 14D, and the terminal 15D are provided protruding from the upper surface of the outsert case 10.

Further, FIG. 15 is a circuit diagram corresponding to the configuration shown in FIG. 13. However, in FIG. 15, the MOSFET chip in FIG. 13 is replaced with an IGBT chip.

As shown in FIG. 15, the semiconductor device includes two IGBT chips 200, two SBD chips 3, the main electrode terminal 5C, the main electrode terminal 5D, the main electrode terminal 5E, the main electrode terminal 5A, the main electrode terminal 5G, the auxiliary electrode terminal 6F, the auxiliary electrode terminal 6E, the auxiliary electrode terminal 6D, the auxiliary electrode terminal 6B, the main electrode terminal 5B, the main electrode terminal 5F, the thermistor 100, the auxiliary electrode terminal 6C, the auxiliary electrode terminal 6A, and the test piece 13D whose both ends are connected to the terminal 14D and the terminal 15D without being connected to other wiring.

(Deterioration Diagnosis of Semiconductor Device)

During an initial use and maintenance of the semiconductor device, a resistance value between the terminal 14D and the terminal 15D is measured. Then, a fluctuation amount of the resistance values is calculated by comparing the resistance value at the time of initial use with the resistance value at the time of maintenance.

Further, from the fluctuation amount of the resistance values, a degree of corrosion progress in the configuration of the metal wire 7, the main electrode terminals, the auxiliary electrode terminals, and the like mounted inside the outsert case 10 is predicted.

According to the semiconductor device of the present embodiment, by using two or more different metals for the test piece 13D, the diagnostic sensitivity to a plurality of types of gases can be enhanced.

Further, according to the semiconductor device of the present embodiment, a progress of corrosion product can be determined when a short circuit occurs due to a progress of migration between the metal pieces configuring the test piece 13D. Therefore, a highly accurate deterioration diagnosis can be performed.

Sixth Embodiment

A semiconductor device according to the present embodiment and a method for diagnosing the semiconductor device will be described. In the following description, components similar to the components described in the above-described embodiment will be illustrated with the same reference signs, and detailed description thereof will be omitted as appropriate.

(Configuration of Semiconductor Device)

FIG. 16 is a schematic side view showing an example of the configuration of the semiconductor device according to the present embodiment. In FIG. 16, the sealing material 9 is partially seen through.

As shown in FIG. 16, the semiconductor device includes the insulating substrate 1, the conductive bonding material 8, the electrode pattern 4, MOSFET chip 2, the SBD chip 3, the metal wire 7, the base plate 11, the outsert case 10, the main electrode terminal 5A, the main electrode terminal 5B, the main electrode terminal 5C, the auxiliary electrode terminal 6A, the auxiliary electrode terminal 6B, the auxiliary electrode terminal 6C, a terminal 14E mounted on the upper surface of the outsert case 10, a terminal 15E mounted on the upper surface of the outsert case 10, a test piece 13E that is extended from the terminal 14E and the terminal 15E and provided on the upper surface of the electrode pattern 4 inside the outsert case 10, and the sealing material 9.

In FIG. 16, the terminal 14E and the terminal 15E are provided separately from the existing terminal. However, for example, as shown in the third embodiment, at least one of the terminal 14E and the terminal 15E may be shared with other terminal.

The test piece 13E is formed of a plurality of metal pieces. Further, each metal piece is formed of any one of a plurality of types of metals. For example, in the plurality of metal pieces arranged in parallel, metal pieces adjacent to each other in parallel are formed of different metals. On the other hand, a plurality of metal pieces arranged in series are formed of the same type of metal.

Further, the plurality of metal pieces arranged in series among the plurality of metal pieces configuring the test piece 13E are arranged at positions insulated from each other on the upper surface of the electrode pattern 4.

Then, the terminal 14E and the terminal 15E are connected to the metal pieces located at the farthest distance among the metal pieces arranged in series configuring the test piece 13E.

Although the test piece 13E is arranged on the upper surface of the electrode pattern 4 in FIG. 16, the test piece 13E may be arranged separated from the electrode pattern 4.

Further, a plurality of test pieces 13E may be provided.

Here, FIG. 17 is a top view corresponding to the configuration shown in FIG. 16. FIG. 16 corresponds to a side view of an X-X' plane in FIG. 17.

As shown in FIG. 17, in the semiconductor device, the main electrode terminal 5A on the P side, the main electrode terminal 5B on the N side, the main electrode terminal 5C of the AC electrode, the main electrode terminal 5D of the AC electrode, the main electrode terminal 5E of the AC electrode, the main electrode terminal 5F on the N side, the main electrode terminal 5G on the P side, the auxiliary electrode terminal 6A, the auxiliary electrode terminal 6B, the auxiliary electrode terminal 6C, the auxiliary electrode terminal 6D, the auxiliary electrode terminal 6E, the auxiliary electrode terminal 6F, the terminal 14E, and the terminal 15E are provided protruding from the upper surface of the outsert case 10.

Further, FIG. 18 is a circuit diagram corresponding to the configuration shown in FIG. 16. However, in FIG. 18, the MOSFET chip in FIG. 16 is replaced with an IGBT chip.

As shown in FIG. 18, the semiconductor device includes two IGBT chips 200, two SBD chips 3, the main electrode terminal 5C, the main electrode terminal 5D, the main electrode terminal 5E, the main electrode terminal 5A, the main electrode terminal 5G, the auxiliary electrode terminal 6F, the auxiliary electrode terminal 6E, the auxiliary electrode terminal 6D, the auxiliary electrode terminal 6B, the main electrode terminal 5B, the main electrode terminal 5F, the thermistor 100, the auxiliary electrode terminal 6C, the auxiliary electrode terminal 6A, and the test piece 13E whose both ends are connected to the terminal 14E and the terminal 15E without being connected to other wiring.

(Deterioration Diagnosis of Semiconductor Device)

During an initial use and maintenance of the semiconductor device, a resistance value between the terminal 14E and the terminal 15E is measured. Then, a fluctuation amount of the resistance values is calculated by comparing the resistance value at the time of initial use with the resistance value at the time of maintenance.

Further, from the fluctuation amount of the resistance values, a degree of corrosion progress in the configuration of the metal wire 7, the main electrode terminals, the auxiliary electrode terminals, and the like mounted inside the outsert case 10 is predicted.

According to the semiconductor device of the present embodiment, by using two or more different types of metals for the test piece 13E, a diagnostic sensitivity to a plurality of types of gases can be enhanced.

Further, according to the semiconductor device of the present embodiment, since the test piece 13E is arranged in parallel with respect to the terminal 14E and the terminal 15E, a progress of corrosion product can be determined when a short circuit occurs in at least one pair due to a progress of migration between the metal pieces arranged in series configuring the test piece 13E. Therefore, a highly accurate deterioration diagnosis can be performed.

(Effects Produced by Above-Described Embodiments)

Next, examples of effects produced by the above-described embodiments will be shown. In the following description, the effects are described based on the specific configurations shown in the embodiments described above, but to the extent that the same effect occurs, the examples in the present specification may be replaced with other specific configurations.

Further, the replacement may be made across a plurality of embodiments. In other words, the respective configurations shown in the examples in different embodiments may be combined to produce the same effect.

According to the embodiments described above, the semiconductor device includes a case, a semiconductor chip, the metal wire 7, at least one test piece 13 (or the test piece 13A, test piece 13B, test piece 13C, test piece 13D, or test piece 13E) and a pair of terminals 14 and 15 (or the terminals 14A and 15A, terminals 14B and 15B, terminals 14C and 15C, terminals 14D and 15D, or terminals 14E and 15E). Here, the case corresponds to, for example, the outsert case 10. Further, the semiconductor chip corresponds to, for example, any one of the MOSFET chip 2 and the SBD chip. The MOSFET chip 2 is provided inside the outsert case 10. The metal wire 7 is bonded to the upper surface of the MOSFET chip 2. The test piece 13 is provided inside the outsert case 10. The terminal 14 and the terminal 15 are provided outside the outsert case 10. Further, the terminal 14 and the terminal 15 are connected to the test piece 13. Here, the test piece 13 is separated from the metal wire 7 inside the outsert case 10.

The semiconductor element (e.g., a power semiconductor element) is generally an element that is susceptible to temperature, humidity, or corrosive gas.

Therefore, when the semiconductor device having the semiconductor chip (MOSFET chip 2 or SBD chip) shown in the above embodiments is used in an environment in which a corrosive gas is present, each component of the semiconductor device may be deteriorated by invasion of corrosive gas inside the outsert case 10. As a result, the semiconductor device may cause a defect typically due to a short circuit.

Here, since it is desirable that the metal wire 7 can carry a large amount of current, the metal wire 7 is generally designed to have a thickness and a length capable of passing a large current. Therefore, a corrosion rate of the metal wire 7 is relatively slow. Therefore, when the metal wire 7 is used for a deterioration diagnosis of the semiconductor device, a fluctuation amount of the resistance values becomes small, and therefore the accuracy of the deterioration diagnosis becomes low.

Further, in many cases, a plurality of metal wires 7 are bonded to each semiconductor chip. Therefore, even when one of the plurality of metal wires 7 bonded to one semiconductor chip is broken due to corrosion, it is difficult to detect the fluctuation of the resistance values. Therefore, when the metal wire 7 is used for the deterioration diagnosis of the semiconductor device, the accuracy of the deterioration diagnosis becomes low.

In contrast, according to the configuration shown in the above embodiments, deterioration of the internal configuration of the semiconductor device (a degree of corrosion progress) can be predicted with high accuracy by calculating the fluctuation amount of the resistance values of the test piece 13 provided apart from the metal wire 7 inside the outsert case 10.

In addition, when at least one of other configurations shown in the present specification is added, as appropriate, to the configuration described above, i.e., even when other configurations described in the examples of the present specification but not mentioned in the above configuration are added, similar effects can be produced.

Further, according to the embodiments described above, the electrode pattern 4 bonded to the lower surface of the MOSFET chip 2 is further provided. According to this configuration, deterioration of the internal configuration of the semiconductor device (a degree of corrosion progress) can be predicted with high accuracy by calculating the fluctuation amount of the resistance values of the test piece 13 provided apart from the metal wire 7.

Further, according to the embodiments described above, at least one of the pair of terminals 14B and 15B is also connected to the electrode pattern 4. According to this configuration, the existing terminal is shared to reduce the number of components by connecting at least one of the terminals 14B and 15B connected to the test piece 13B also to the electrode pattern 4 via the auxiliary electrode terminal 6C, which is the existing terminal. As a result, the manufacturing cost of the semiconductor device can be suppressed.

Further, according to the embodiments described above, the test piece 13C is part of the electrode pattern 4 bonded to the lower surface of the MOSFET chip 2. According to this configuration, the manufacturing cost of the semiconductor device can be suppressed by using part of the electrode pattern 4 also as the test piece 13C to reduce the number of components. In addition, since there is no difference in the degree of corrosion progress caused by a difference in metal materials used for the test piece and the electrode pattern 4, a time spent for selecting a metal material suitable for the test piece can be saved and also the accuracy of deterioration diagnosis can be increased.

Further, according to the embodiments described above, the test piece 13D (or the test piece 13E) is formed of a plurality of metal pieces that are insulated from each other.

According to this configuration, it can be determined that the corrosion product has progressed when a short circuit occurs due to the progress of migration between the metal pieces configuring the test piece 13D (or the test piece 13E). Therefore, a highly accurate deterioration diagnosis can be performed.

Further, according to the embodiments described above, at least two of the plurality of metal pieces are formed of metals different from each other. According to this configuration, by using two or more different types of metals for the test piece 13D, the diagnostic sensitivity to a plurality of types of gases can be enhanced.

Further, according to the embodiments described above, the plurality of metal pieces are arranged in series with respect to the pair of terminals 14D and 15D. According to this configuration, it can be determined that the corrosion product has progressed when a short circuit occurs due to the progress of migration between the metal pieces configuring the test piece 13D. Therefore, a highly accurate deterioration diagnosis can be performed.

Further, according to the above-described embodiments, metal pieces formed of different metals are alternately arranged in series. According to this configuration, it can be determined that the corrosion product has progressed when a short circuit occurs due to the progress of migration between the metal pieces configuring the test piece 13D. At the same time, by using two or more different metals for the test piece 13D, the diagnostic sensitivity to a plurality of types of gases can be enhanced.

Further, according to the embodiments described above, the plurality of metal pieces are arranged in parallel with respect to the pair of terminals 14E and 15E. According to this configuration, since the test piece 13E is arranged in parallel with respect to the terminal 14E and the terminal 15E, it can be determined that the corrosion product has progressed when a short circuit occurs in a least one pair due to the progress of migration between the metal pieces arranged in series that configure the test piece 13E. Therefore, a highly accurate deterioration diagnosis can be performed.

Further, according to the above-described embodiment, metal pieces formed of different metals are arranged in parallel. According to this configuration, it can be determined that the corrosion product has progressed when a short circuit occurs in a least one pair due to the progress of migration between the metal pieces arranged in series that configure the test piece 13E. Therefore, for example, it is possible to diagnose the degree of corrosion progress of each metal or component in response to a corrosive gas that differs by metal or component.

Further, according to the embodiments described above, the semiconductor device includes a plurality of test pieces 13A. Then, the plurality of test pieces 13A are separated from each other. According to this configuration, a diagnosis of deterioration due to corrosive gas can be performed at a plurality of locations of the semiconductor device.

Further, according to the embodiments described above, the plurality of test pieces 13A are formed of the same type of metal. According to this configuration, the deterioration diagnosis can be performed at a plurality of locations having different magnitudes of influence by the corrosive gas. Therefore, for example, it is possible to create an index for confirming the reaction rate of corrosion or the degree of progress of internal corrosion, based on the difference in resistance values measured from the plurality of test pieces.

Further, according to the embodiments described above, the plurality of test pieces 13A are formed of different metals. According to this configuration, the diagnostic sensitivity to a plurality of types of gases can be enhanced.

According to the embodiments described above, in the method for diagnosing the semiconductor device, the test piece 13 is separated from the metal wire 7 bonded to the upper surface of the MOSFET chip 2 inside the outsert case 10. Then, the deterioration diagnosis of the semiconductor device including the MOSFET chip 2 is performed using the pair of terminals 14 and 15 provided outside the outsert case 10 and connected to the test piece 13.

According to this configuration, deterioration of the internal configuration of the semiconductor device (a degree of corrosion progress) can be predicted with high accuracy by calculating the fluctuation amount of the resistance values of the test piece 13 provided apart from the metal wire 7 inside the outsert case 10.

In addition, when at least one of other configurations shown in the present specification is added, as appropriate, to the configuration described above, i.e., even when other configurations described in the examples of the present specification but not mentioned in the above configuration are added, similar effects can be produced.

Further, unless particularly restricted, the order in which each process is performed can be changed.

(Modified Example in Above-Described Embodiments)

In the embodiments described above, material quality, materials, dimensions, shapes, relative arrangement relationships, implementation conditions or the like of each component may also be described, but these are examples in all aspects. The present invention is not limited to those described in the present specification.

Therefore, innumerable variants and equivalents not shown are envisioned within the scope of the technique disclosed herein. For example, the present invention includes transforming, adding, or omitting at least one component, or extracting at least one component in at least one embodiment and combining it with components in another embodiment.

In addition, as long as there is no contradiction, the components described as being provided with "one" in the above-described embodiments may be provided with "one or more".

Further, each component in the above-described embodiments is a conceptual unit, and the scope of the technique disclosed in the present specification shall include the case where one component is composed of a plurality of structures, one component corresponds to a part of a structure, and a plurality of components are provided in one structure.

In addition, each component in the above-described embodiments shall include a structure having another structure or shape as long as it exhibits the same function.

In addition, the description in the present specification is referred to for all purposes related to the present technique, and none of them is recognized as a conventional technique.

Further, in the above-described embodiments, when a material name or the like is described without being specified, the material shall include other additives such as an alloy as long as there is no contradiction.

EXPLANATION OF REFERENCE SIGNS

1: insulating substrate
2: MOSFET chip
3: SBD chip
4: electrode pattern
5A,5B,5C,5D,5E,5F,5G: main electrode terminal
6A,6B,6C,6D,6E,6F: auxiliary electrode terminal 7: metal wire
8: conductive bonding material
9: sealing material
10: outsert case
11: base plate
12: adhesive
13,13A,13B,13C,13D,13E: test piece
14,14A,14B,14C,14D,14E,15,15A,15B,15C,15D,15E: terminal
100: thermistor
200: IGBT chip

The invention claimed is:

1. A semiconductor device comprising:
a case;
a semiconductor chip inside the case;
a metal wire bonded to an upper surface of the semiconductor chip;
at least one metal test piece inside the case for deterioration observation of the semiconductor device; and
a pair of terminals provided outside the case, each side of the test piece being directly connected to a respective terminal of the pair of terminals; and
an electrode pattern bonded to a lower surface of the semiconductor chip, wherein
the test piece is separated from the metal wire inside the case, and
at least one of the pair of terminals is also connected to the electrode pattern.

2. The semiconductor device according to claim 1, wherein the at least one test piece is a part of the electrode pattern bonded to the lower surface of the semiconductor chip.

3. The semiconductor device according to claim 1, wherein the test piece is configured with a plurality of metal pieces that are insulated from each other, the plurality of metal pieces being between the pair of terminals.

4. The semiconductor device according to claim 3, wherein at least two of the plurality of metal pieces are configured with metals different from each other.

5. The semiconductor device according to claim 3, wherein at least two of the plurality of metal pieces are configured with metals different from each other, the metals different from each other having different deterioration sensitivities to a plurality of types of gases.

6. The semiconductor device according to claim 3, wherein the plurality of metal pieces are arranged in series with each other with respect to the pair of terminals.

7. The semiconductor device according to claim 6, wherein the metal pieces configured with metals different from each other are alternately arranged in series with each other.

8. The semiconductor device according to claim 6, wherein the metal pieces configured with metals different from each other are alternately arranged in series with each other, the metals different from each other having different deterioration sensitivities to a plurality of types of gases.

9. The semiconductor device according to claim 3, wherein the plurality of metal pieces are arranged in parallel with respect to the pair of terminals.

10. The semiconductor device according to claim 9, wherein the metal pieces configured with metals different from each other are arranged in parallel.

11. The semiconductor device according to claim 9, wherein the metal pieces configured with metals different from each other are arranged in parallel, the metals different from each other having different deterioration sensitivities to a plurality of types of gases.

12. The semiconductor device according to claim 1, wherein the test piece is included among a plurality of test pieces, and the plurality of test pieces are separated from each other,
the plurality of test pieces includes another test piece different from the test piece, the another test piece being between another pair of terminals different from the pair of terminals.

13. The semiconductor device according to claim 12, wherein the plurality of test pieces are configured with a same type of metal.

14. The semiconductor device according to claim 12, wherein the plurality of test pieces are configured with different metals.

15. The semiconductor device according to claim 12, wherein the plurality of test pieces are configured with different metals, the different metals having different deterioration sensitivities to a plurality of types of gases.

16. The semiconductor device according to claim 1, wherein the test piece is a single conductive piece.

17. A method for diagnosing deterioration of a semiconductor device by using at least one test piece inside a case, wherein
the test piece is separated from a metal wire bonded to an upper surface of a semiconductor chip inside the case,
the method comprising
diagnosing deterioration of the semiconductor device including the semiconductor chip by determining a fluctuation amount of a resistance measured across a pair of terminals provided outside the case and connected to the test piece, each side of the test piece being directly connected to a respective terminal of the pair of terminals, wherein
an electrode pattern is bonded to a lower surface of the semiconductor chip, and at least one of the pair of terminals is also connected to the electrode pattern.

18. A semiconductor device comprising:
a case;
a semiconductor chip inside the case;
a metal wire bonded to an upper surface of the semiconductor chip;
at least one metal test piece for deterioration observation of the semiconductor chip inside the case; and
a pair of terminals provided outside the case, each side of the test piece being directly connected to a respective terminal of the pair of terminals, wherein
the test piece is separated from the metal wire inside the case
the test piece is configured with a plurality of metal pieces that are insulated from each other.

* * * * *